United States Patent
Hung et al.

(10) Patent No.: US 9,553,047 B2
(45) Date of Patent: Jan. 24, 2017

(54) METHOD OF MANUFACTURING SEMICONDUCTOR DEVICES WITH COMBINED ARRAY AND PERIPHERY PATTERNING IN SELF-ALIGNED QUADRUPLE PATTERNING

(71) Applicant: Macronix International Co. Ltd., Hsin-chu (TW)

(72) Inventors: Yu-Min Hung, Taichung (TW); Tzung-Ting Han, Hsinchu (TW); Miao-Chih Hsu, Hsinchu (TW)

(73) Assignee: Macronix International Co., Ltd., Hsin-Chu (TW)

( * ) Notice: Subject to any disclaimer, the term of this patent is extended or adjusted under 35 U.S.C. 154(b) by 0 days.

(21) Appl. No.: 14/735,790

(22) Filed: Jun. 10, 2015

(65) Prior Publication Data

US 2016/0365310 A1    Dec. 15, 2016

(51) Int. Cl.
| | |
|---|---|
| *H01L 23/528* | (2006.01) |
| *H01L 21/768* | (2006.01) |
| *H01L 21/3213* | (2006.01) |
| *H01L 27/112* | (2006.01) |

(52) U.S. Cl.
CPC ....... *H01L 23/528* (2013.01); *H01L 21/32133* (2013.01); *H01L 21/32139* (2013.01); *H01L 21/76892* (2013.01); *H01L 27/11293* (2013.01)

(58) Field of Classification Search
CPC ............ H01L 23/528; H01L 21/32139; H01L 27/11293; H01L 21/76892; H01L 21/32133
See application file for complete search history.

(56) References Cited

U.S. PATENT DOCUMENTS

| | | | |
|---|---|---|---|
| 8,835,100 | B2 | 9/2014 | Yang |
| 2004/0043542 | A1 | 3/2004 | Park et al. |
| 2013/0237050 | A1* | 9/2013 | Kikutani ........... H01L 27/11573 438/618 |
| 2014/0103446 | A1 | 4/2014 | Lim et al. |
| 2015/0199929 | A1* | 7/2015 | Kim ........................ G09G 3/006 324/762.01 |
| 2015/0325478 | A1* | 11/2015 | Seong ................. H01L 21/0337 257/773 |

FOREIGN PATENT DOCUMENTS

TW               451321 B       8/2001

* cited by examiner

*Primary Examiner* — Wael M. Fahmy
*Assistant Examiner* — Sue Tang
(74) *Attorney, Agent, or Firm* — Alston & Bird LLP

(57) ABSTRACT

Provided are improved semiconductor memory devices and methods for manufacturing such semiconductor memory devices. A method may incorporate the patterning of the array and periphery regions in self-aligned quadruple patterning and provide semiconductor devices resulting from the combined patterning.

11 Claims, 17 Drawing Sheets

Figure 1A:
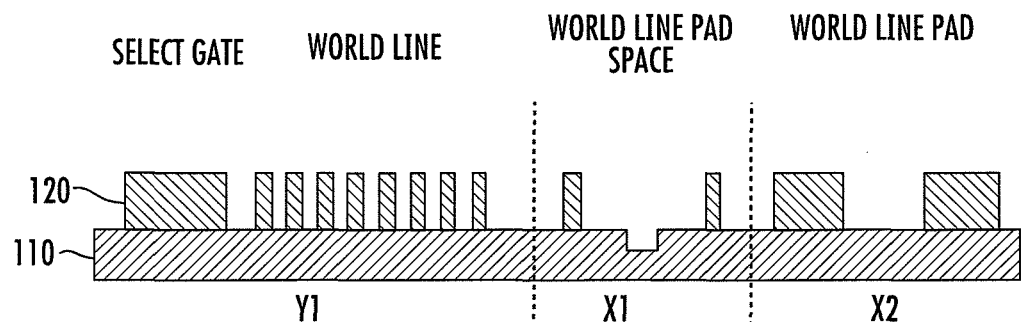

METHOD OF MANUFACTURING SEMICONDUCTOR DEVICES WITH COMBINED ARRAY AND PERIPHERY PATTERNING IN SELF-ALIGNED QUADRUPLE PATTERNING

FIELD

Embodiments of the present invention generally relate to a semiconductor device, and methods of preparing the semiconductor device.

BACKGROUND

Fabrication of an integrated circuit involves processes that can generally be categorized as deposition, patterning, and doping. With the use of these different processes complex structures having various components may be built to form the complex circuitry of a semiconductor device.

Lithography is the formation of a three-dimensional patterning on a substrate to form a pattern to the substrate. A multiplicity of lithographic procedures combined with etching and/or polishing may be performed to create a final semiconductor device.

Photolithography or optical lithography involves the use of a light sensitive polymer or a photoresist that is exposed and developed to form three-dimensional patterning on a substrate. The parts of the substrate that remain covered with the photoresist will be protected from subsequent etching, ion implantation, or certain other processing techniques.

The general sequence for a photolithography process may include the steps of preparing the substrate, applying a photoresist, prebaking, exposing, post-exposure baking, developing, and post-baking. Photoresists may be applied to the substrate by any number of techniques. Generally, it is somewhat important to establish a uniform thickness of the photoresist across the substrate. Optionally, a layer of bottom anti reflectivity coating (BARC) may be applied to the substrate prior to the application of the photoresist layer. Adhesion promoters may be typically applied to the substrate prior to application of the photoresist.

The premise behind photolithography is the change in solubility of the positive photoresist in a positive tone developer throughout certain regions of the photoresist that have been exposed to light, in the past visible light but more conventionally ultraviolet light, or some other form of radiation. The regions of exposure may be controlled, for example, with the use of a mask.

Applicant has identified deficiencies and problems associated with conventional processes for manufacturing memory devices and the resulting memory devices. For instance, in conventional manufacturing processes, the array and periphery regions must be formed separately using separate patterning steps. The resulting process is both time consuming and costly.

Through applied effort, ingenuity, and innovation, certain of these identified problems have been solved by developing solutions that are included in various embodiments of the present invention, which are described in detail below.

SUMMARY

Embodiments of the present invention therefore provide methods of manufacturing semiconductor devices useful in the manufacture of memory devices and provide semiconductor memory devices resulting from such methods.

The present invention provides methods of manufacturing semiconductor devices at a reduced cost and with greater efficiency. In certain embodiments, the patterning of the array region and the periphery region of the semiconductor device may be combined such that one mask is used to pattern both regions. The present inventors have devised a layout for the semiconductor device that allows for the integration of array and periphery patterning. By integrating the patterning of the array region and the periphery region, the cost can be reduced and the efficiency of preparing suitable semiconductor devices can be increased.

In certain embodiments of the invention, a semiconductor device is provided comprising a substrate; a first word line pad formed on the substrate; and a second word line pad formed on the substrate, wherein the first word line pad comprises a first pad width adjacent to a word line and a second pad width opposite the word line, wherein the first pad width is not equal to the second pad width. In some embodiments, the semiconductor device comprises a space located between the first word line pad and the second word line pad, the space comprising a first width of the space represented by a. In certain embodiments, the device comprises a space located between the first word line pad and the second word line pad, the space comprising a first width of the space represented by a and a second width of the space represented by b, wherein a is less than b.

In some embodiments, the semiconductor device comprises a first word line pad that comprises a first pad width adjacent to a word line and a second pad width opposite the word line, wherein the first pad width is not equal to the second pad width. In certain embodiments, the first pad width is less than the second pad width. Still further, in some embodiments, the first pad width is smaller than the second pad width by about 0.05 to 1.5 times width a. For instance, in some embodiments, the first pad width is smaller than the second pad width by about 0.05 times width a while in some embodiments, the first pad width is smaller than the second pad width by about 1.5 times width a.

In certain embodiments, the semiconductor device comprises a second word line pad that comprises a first width of the second word line pad and a second width of the second word line pad, wherein the first width of the second word line pad is smaller than the second width of the second word line pad by about 0.05 to 1.5 times width a. In some embodiments, the first word line pad is a mirror image of the second word line pad.

An aspect of the invention also provides a method for manufacturing a semiconductor device comprising providing a substrate; forming a film stack along the substrate; and etching the film stack to form a first word line pad and a second word line pad, wherein the first word line pad comprises a first pad width adjacent to a word line and a second pad width opposite the word line, wherein the first pad width is not equal to the second pad width. In some embodiments, etching the film stack to form a first word line pad and a second word line pad comprises forming a space between the first word line pad and the second word line pad, the space comprising a first width of the space represented by a. In certain embodiments, etching the film stack to form a first word line pad and a second word line pad comprises forming a space located between the first word line pad and the second word line pad, the space comprising a first width of the space represented by a and a second width of the space represented by b, wherein a is less than b. In certain embodiments, the method further comprises forming a photo resist along select regions of the film stack prior to etching the film stack to form the first word line pad and the second word line pad.

In certain embodiments of the invention, the method of manufacturing a semiconductor device further comprises forming a first core material along the film stack; forming a second core material along the film stack; patterning the second core material to form a patterned second core; forming second core spacers along sidewalls of the patterned second core; removing the patterned second core; patterning the first core material to form a patterned first core; forming first core spacers along sidewalls of the patterned first core; and removing portions of the patterned first core.

In some embodiments, patterning the second core material to form a patterned second core comprises forming a photo resist along select regions of the substrate and etching the first core material not covered by the photo resist. In some embodiments, patterning the second core material to form a patterned second core comprises forming a pad pattern and a word line pattern, wherein the pad pattern has a width of greater than about 600 nm and the word line pattern has a width of about 10 to about 30 nm. In certain embodiments, patterning the first core material to form a patterned first core comprises forming a photo resist along select regions of the substrate and etching the first core material not covered by the photo resist. In some embodiments, forming second core spacers along sidewalls of the patterned second core comprises forming spacers with a width of about 20 to about 40 nm.

In some embodiments of the invention, the method further comprises trimming the patterned first core. For instance, in some embodiments, trimming the patterned first core comprises trimming a word line pattern to have a width of about 10 to about 20 nm.

In certain embodiments, removing portions of the patterned first core comprises removing the patterned first core in a semicircle in a pad pattern along the film stack. For instance, removing the patterned first core may comprise forming a semicircle with a radius of about 200 to 300 nm.

In some embodiments of the method of manufacturing a semiconductor device, forming a first word line pad comprises forming a first word line pad that comprises a first pad width adjacent to a word line and a second pad width opposite the word line and wherein the first pad width is smaller than the second pad width by about 0.05 to 1.5 times width a.

The above summary is provided merely for purposes of summarizing some example embodiments of the invention so as to provide a basic understanding of some aspects of the invention. Accordingly, it will be appreciated that the above described example embodiments are merely examples and should not be construed to narrow the scope or spirit of the invention in any way. It will be appreciated that the scope of the invention encompasses many potential embodiments, some of which will be further described below, in addition to those here summarized.

BRIEF DESCRIPTION OF THE DRAWING(S)

Figure 1B:
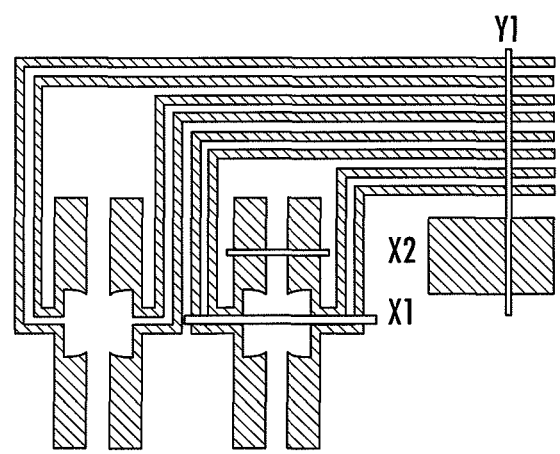
Figure 1C:
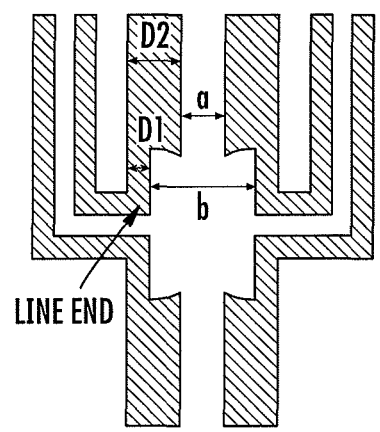
Figure 2A:
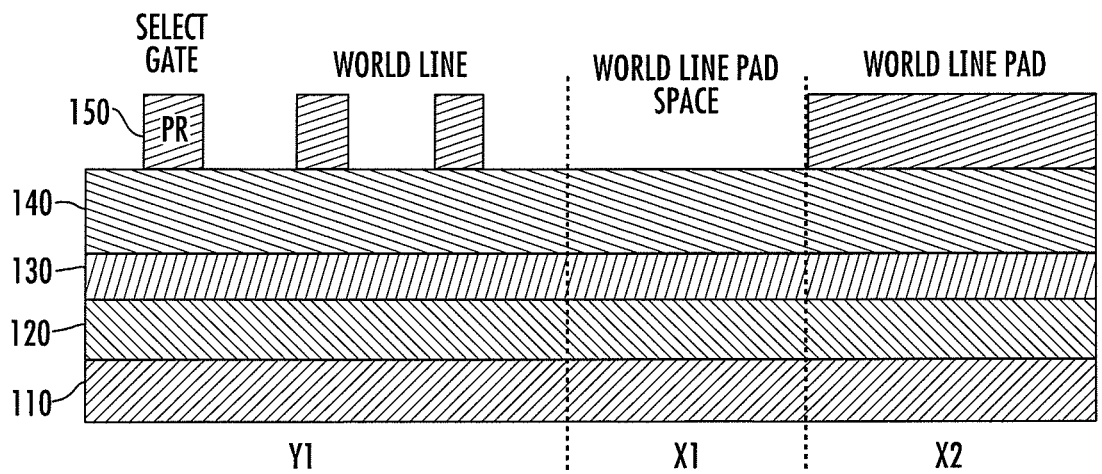
Figure 2B:
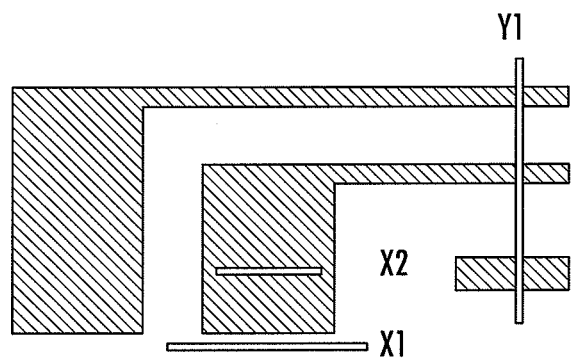
Figure 2C:
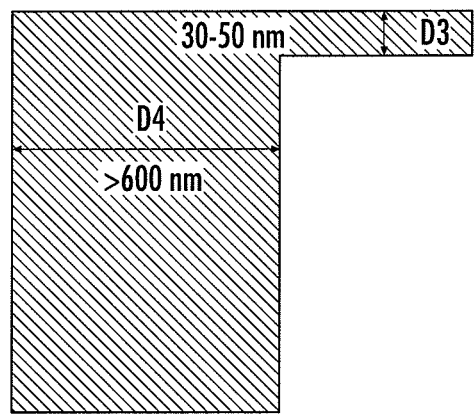
Figure 3A:
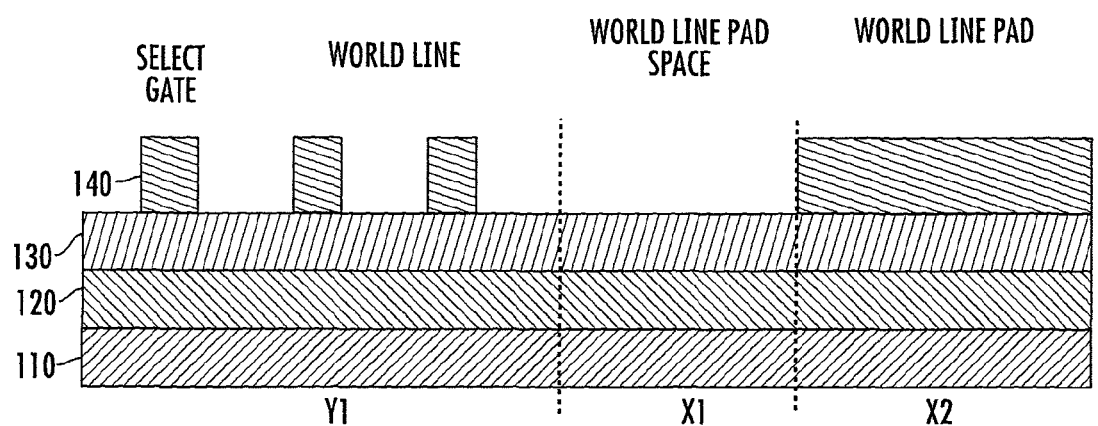
Figure 3B:
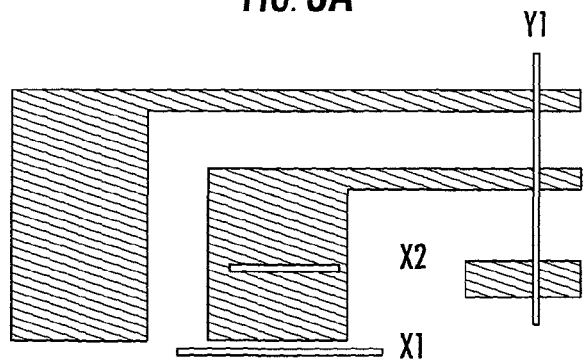
Figure 3C:
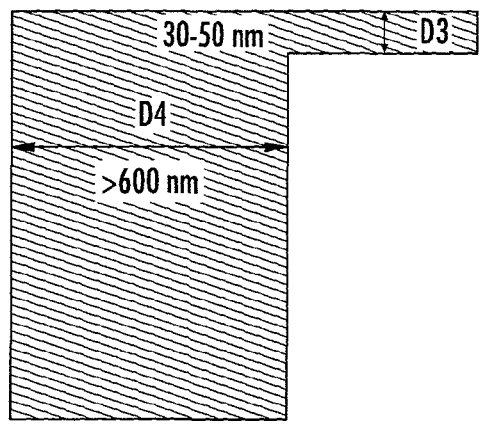
Figure 4A:
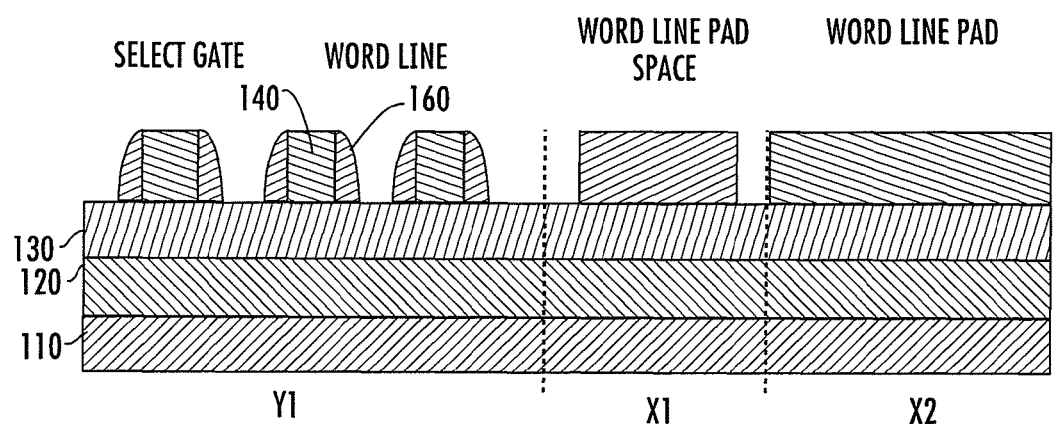
Figure 4B:
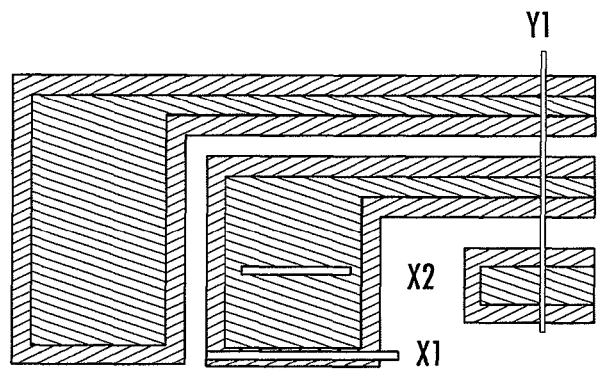
Figure 4C:
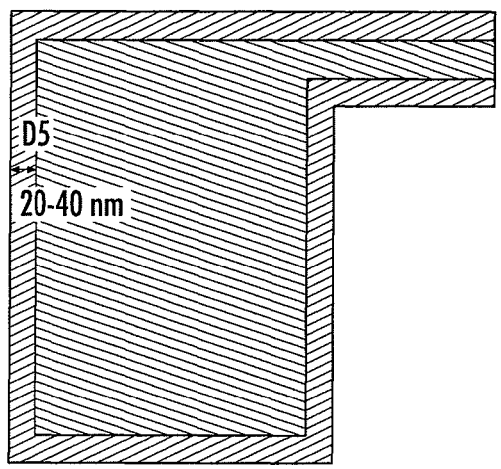
Figure 5A:
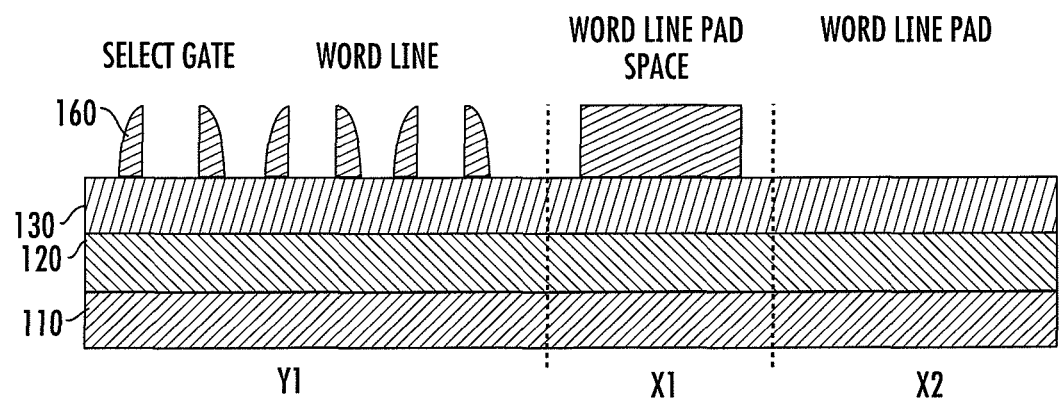
Figure 5B:
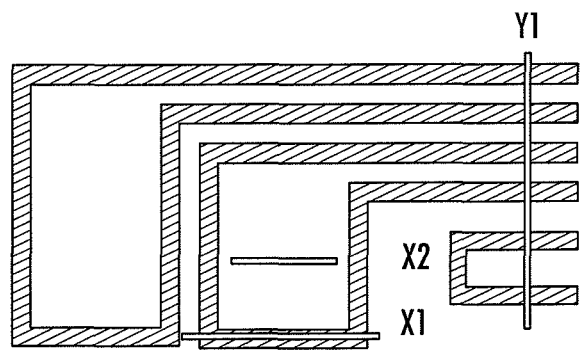
Figure 6A:
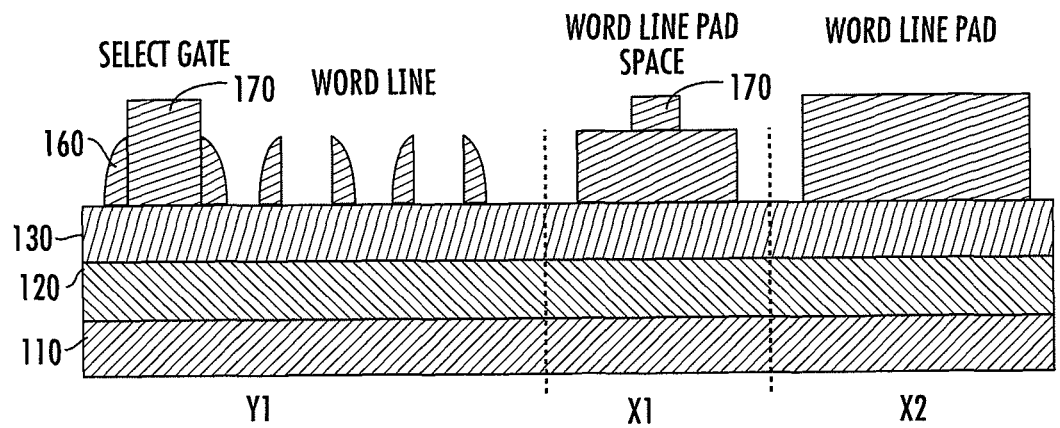
Figure 6B:
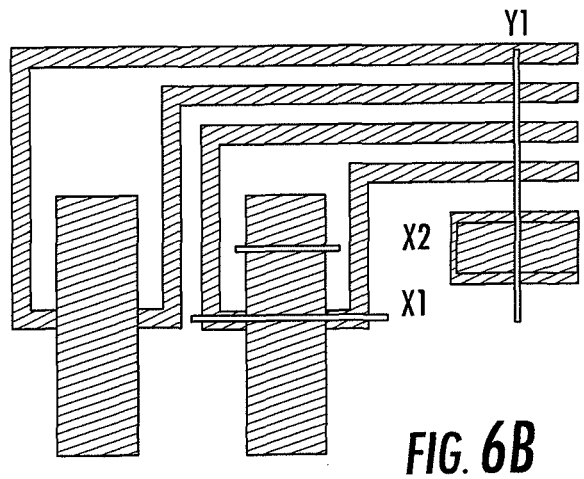
Figure 6C:
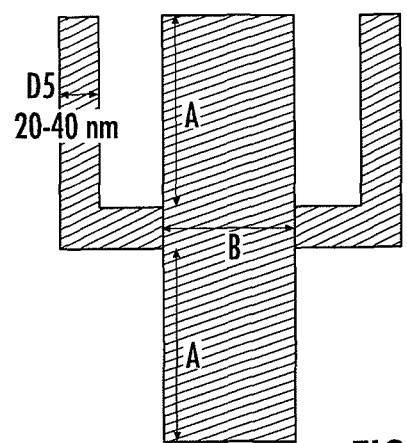
Figure 7A:
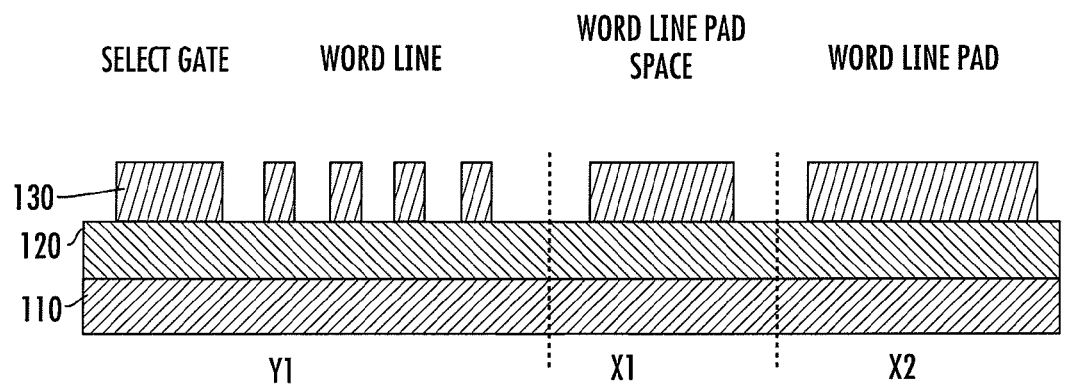
Figure 7B:
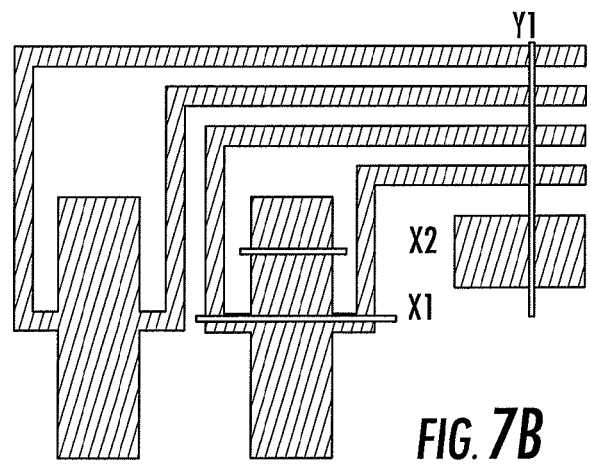
Figure 7C:
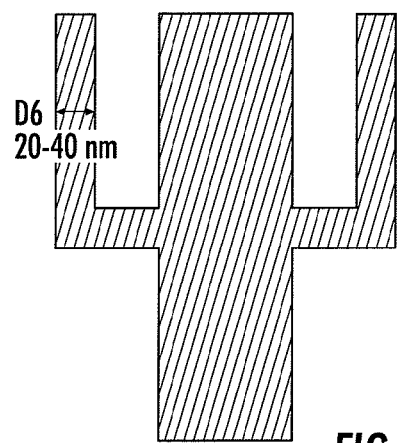
Figure 8A:
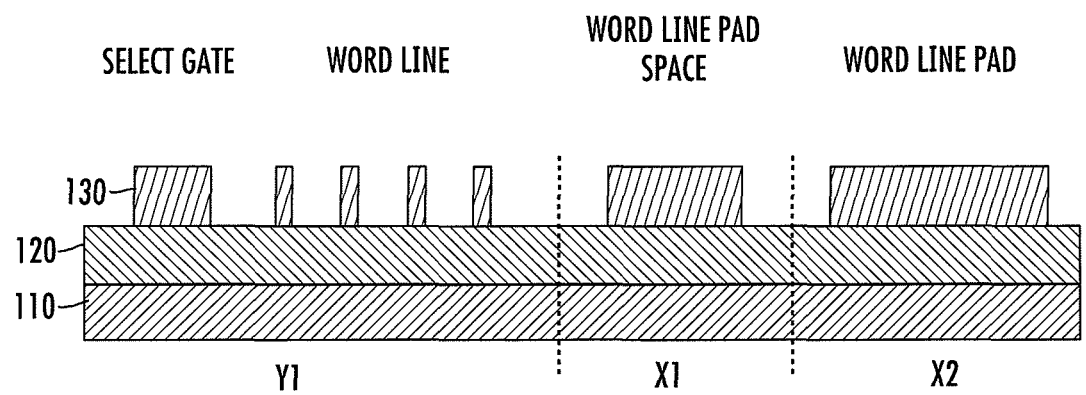
Figure 8B:
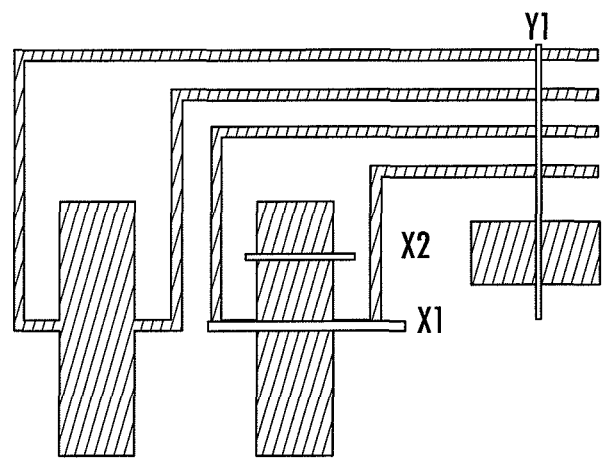
Figure 8C:
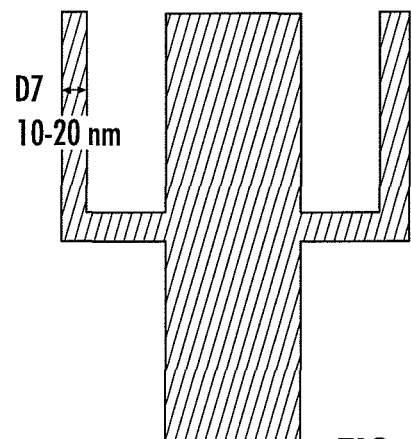
Figure 9A:
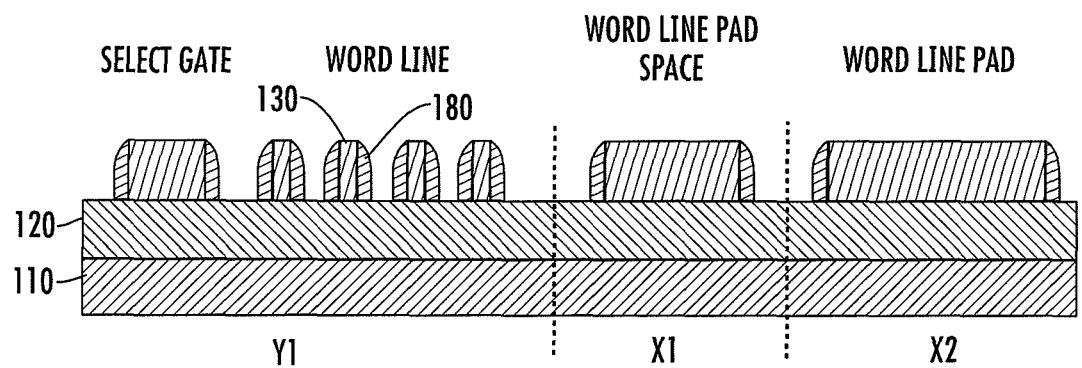
Figure 9B:
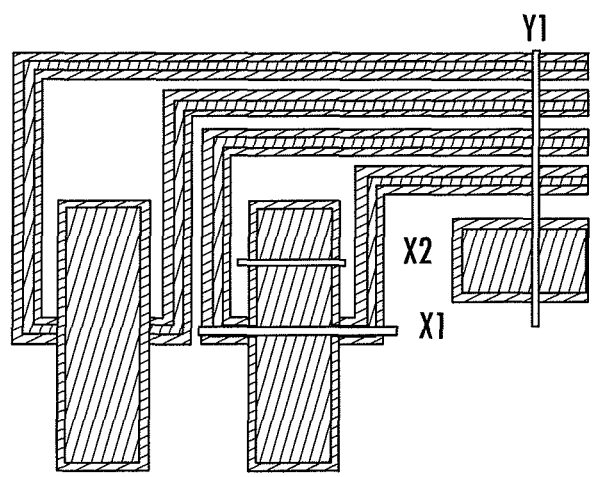
Figure 9C:
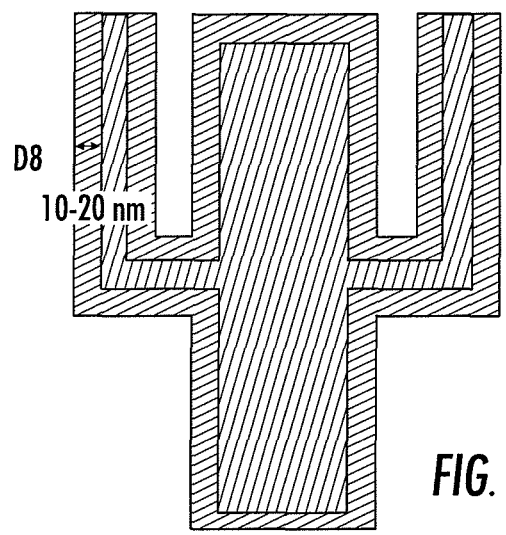
Figure 10A:
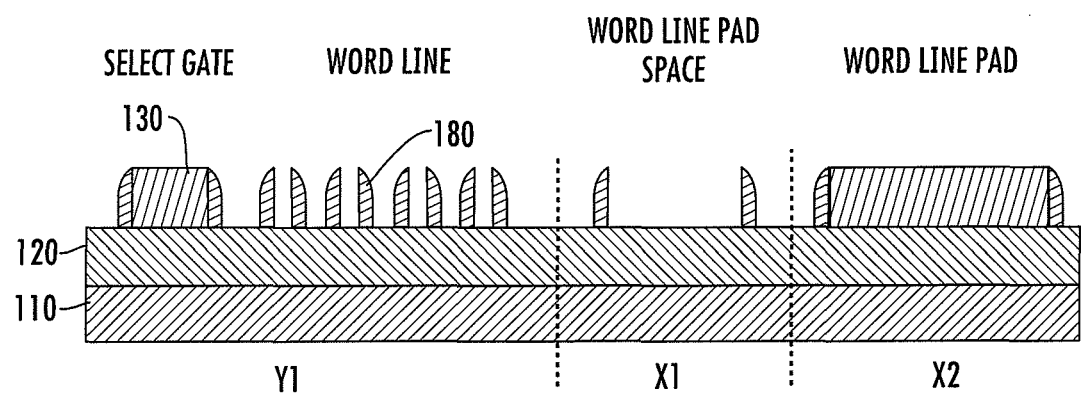
Figure 10B:
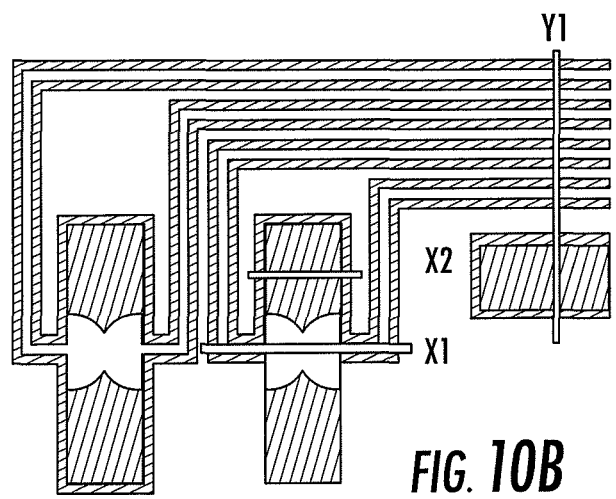
Figure 10C:
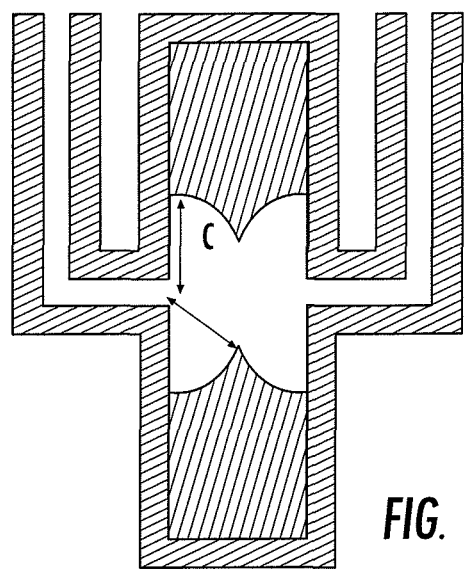
Figure 11:
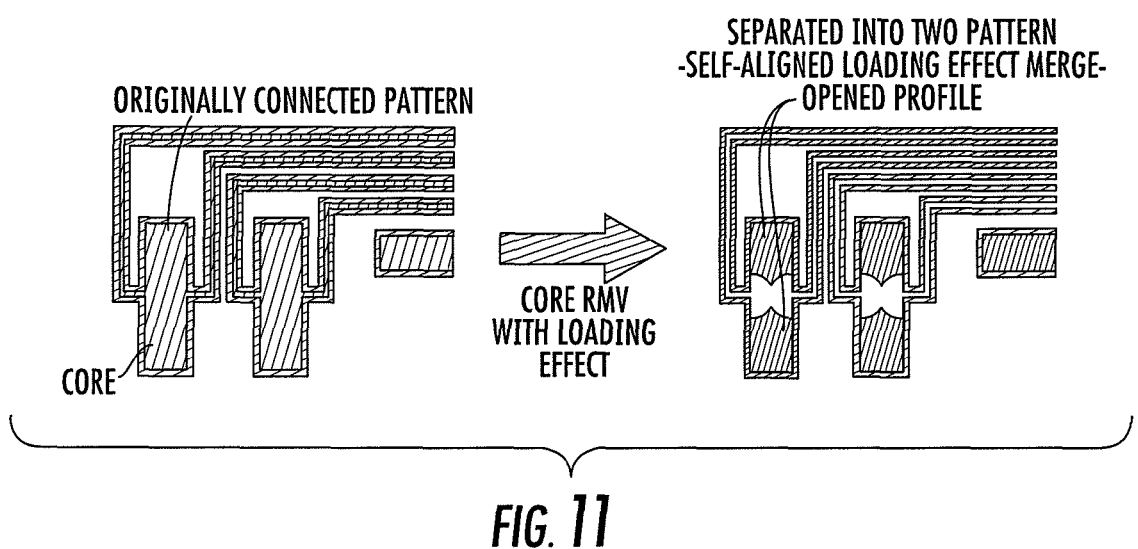
Figure 12A:
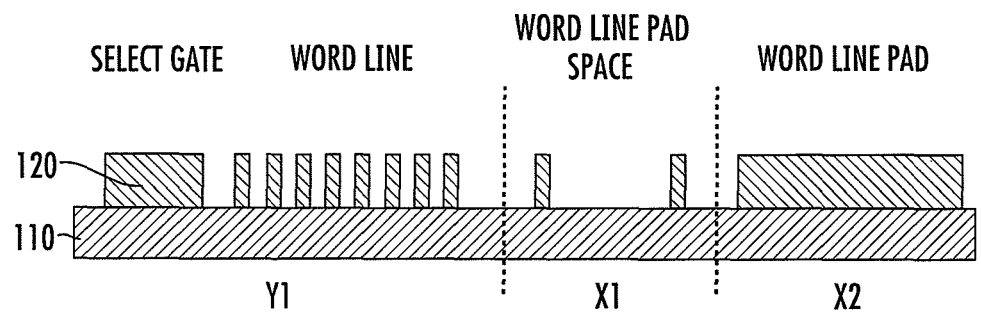
Figure 12B:
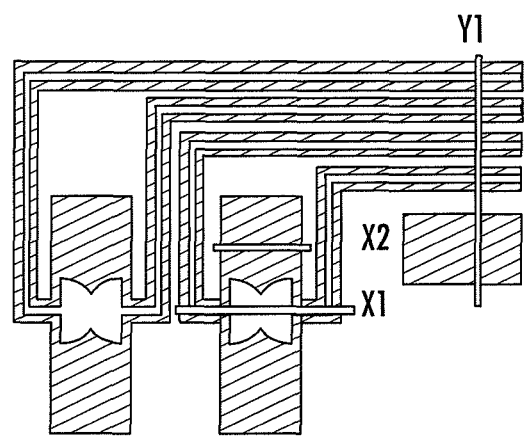
Figure 12C:
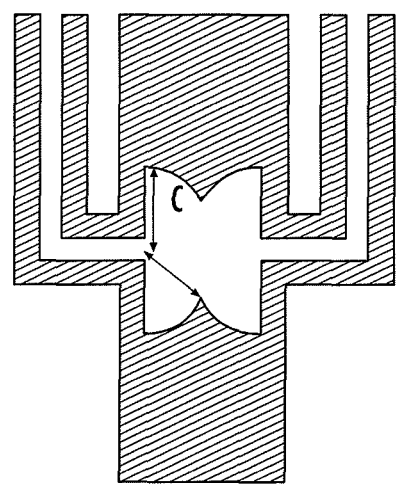
Figure 13A:
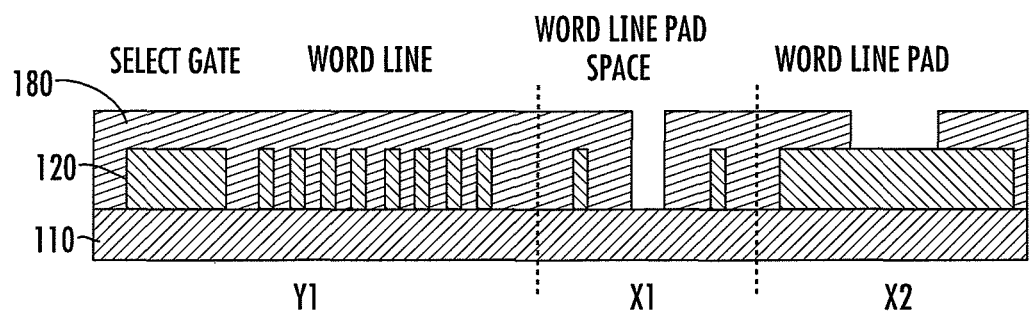
Figure 13B:
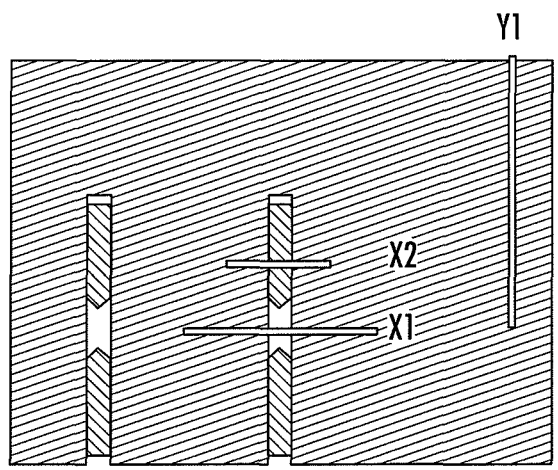
Figure 13C:
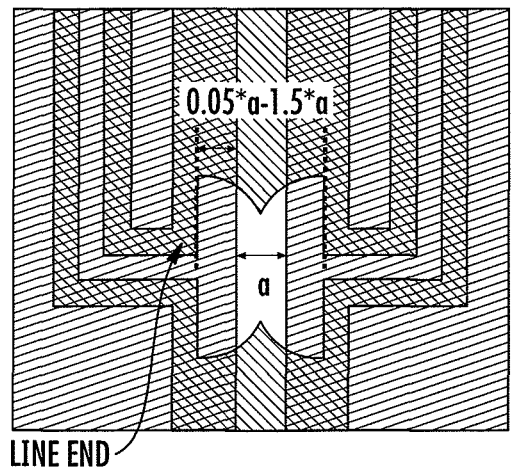
Figure 14A:
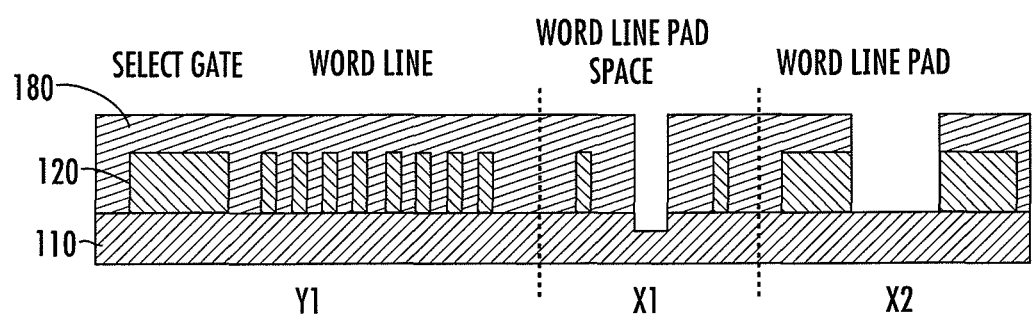
Figure 14B:
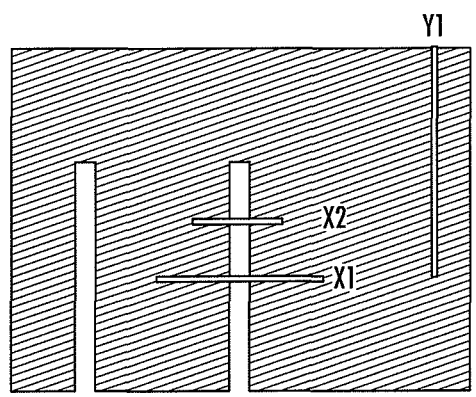
Figure 15:
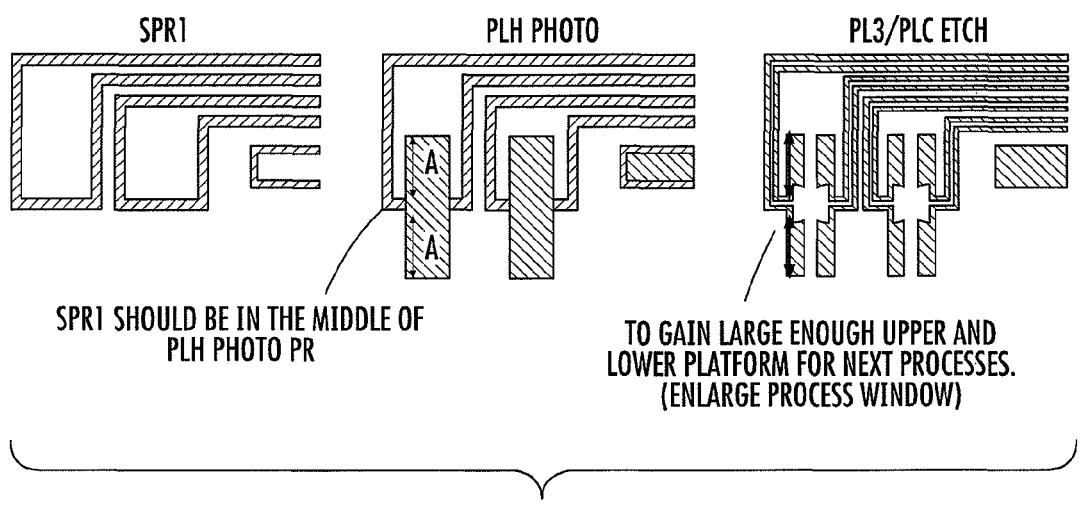
Figure 16A:
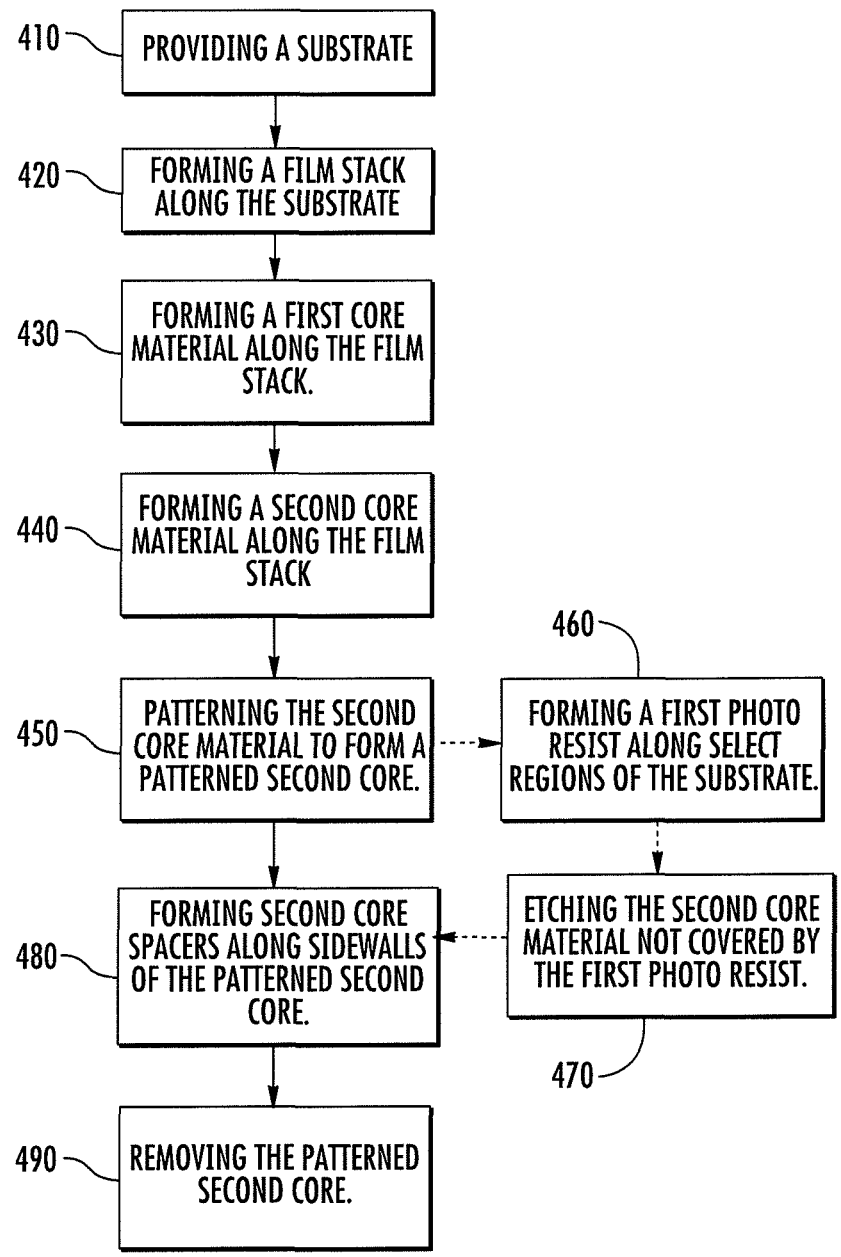
Figure 16B:
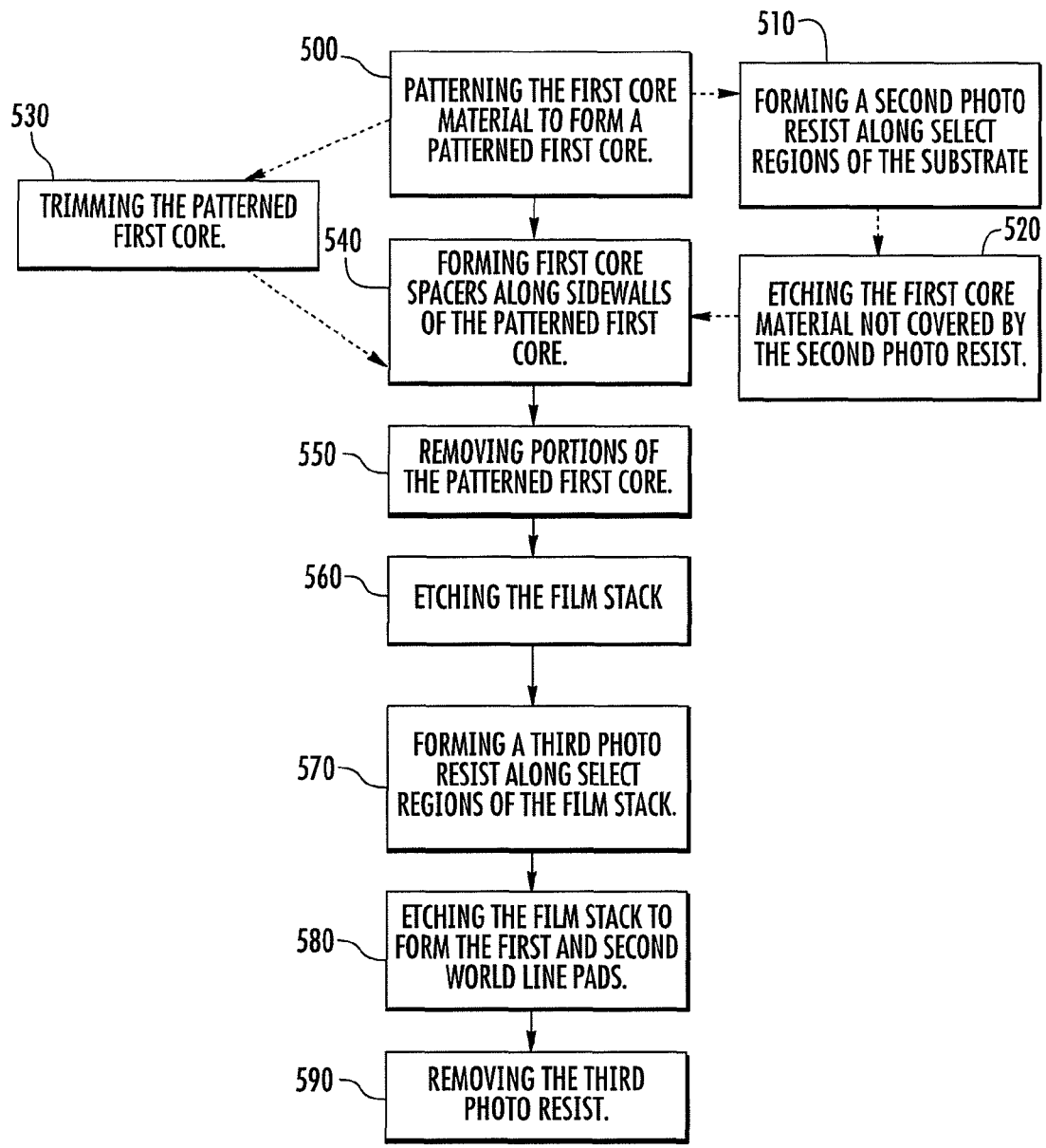

Having thus described the invention in general terms, reference will now be made to the accompanying drawings, which are not necessarily drawn to scale, and wherein:

FIGS. 1(a) to 1(c) illustrate cross-sectional views of a semiconductor device prepared in accordance with embodiments of the present invention;

FIGS. 2(a) to 2(c) illustrate cross-sectional views of a semiconductor device after applying a photo resist to the device in accordance with embodiments of the present invention;

FIGS. 3(a) to 3(c) illustrate cross-sectional views of a semiconductor device after etching a second core layer to form a patterned second core layer in accordance with embodiments of the present invention;

FIGS. 4(a) to 4(c) illustrate cross-sectional views of a semiconductor device after forming spacers along the sidewalls of the patterned second core layer in accordance with embodiments of the present invention;

FIGS. 5(a) to 5(b) illustrate cross-sectional views of a semiconductor device after removing the patterned second core layer in accordance with embodiments of the present invention;

FIGS. 6(a) to 6(c) illustrate cross-sectional views of a semiconductor device after applying a photo resist in accordance with embodiments of the present invention;

FIGS. 7(a) to 7(c) illustrate cross-sectional views of a semiconductor device after etching a patterned first core layer in accordance with embodiments of the present invention;

FIGS. 8(a) to 8(c) illustrate cross-sectional views of a semiconductor device after trimming the patterned first core material in accordance with embodiments of the present invention;

FIGS. 9(a) to 9(c) illustrate cross-sectional views of a semiconductor device after forming spacers 180 along the sidewalls of the patterned first core layer in the device in accordance with embodiments of the present invention;

FIGS. 10(a) to 10(c) illustrate cross-sectional views of a semiconductor device after removing portions of the patterned first core layer in the device in accordance with embodiments of the present invention;

FIG. 11 illustrates cross-sectional views of a semiconductor device after removal of portions of the first patterned core layer in accordance with embodiments of the present invention;

FIGS. 12(a) to 12(c) illustrate cross-sectional views of a semiconductor device after etching the film stack to form word lines, pads, and transistors in the semiconductor device in accordance with embodiments of the present invention;

FIGS. 13(a) to 13(c) illustrate cross-sectional views of a semiconductor device after applying a photo resist to cut a pad into multiple pads in accordance with embodiments of the present invention;

FIGS. 14(a) to 14(b) illustrate cross-sectional views of a semiconductor device after etching the film stack to form separate adjacent pads in accordance with embodiments of the present invention;

FIG. 15 illustrates certain steps of embodiments of the present invention in preparing semiconductor devices; and FIGS. 16(a) and 16(b) provide a flow chart detailing a method of forming a semiconductor device in accordance with embodiments of the present invention.

DETAILED DESCRIPTION

Some embodiments of the present invention will now be described more fully hereinafter with reference to the accompanying drawings, in which some, but not all embodiments of the invention are shown. Indeed, various embodiments of the invention may be embodied in many different forms and should not be construed as limited to the embodiments set forth herein; rather, these embodiments are provided so that this disclosure will satisfy applicable legal requirements.

As used in the specification and in the appended claims, the singular forms "a", "an", and "the" include plural referents unless the context clearly indicates otherwise. For example, reference to "a gate structure" includes a plurality of such gate structures.

Unless otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in this specification and attached claims are approximations that can vary depending upon the desired properties sought to be obtained by the presently disclosed subject matter.

As used herein, the term "about," when referring to a value or to an amount of mass, weight, time, volume, concentration or percentage is meant to encompass variations of in some embodiments ±20%, in some embodiments ±10%, in some embodiments ±5%, in some embodiments ±1%, in some embodiments ±0.5%, and in some embodiments ±0.1% from the specified amount, as such variations are appropriate to perform the disclosed method.

Although specific terms are employed herein, they are used in a generic and descriptive sense only and not for purposes of limitation. All terms, including technical and scientific terms, as used herein, have the same meaning as commonly understood by one of ordinary skill in the art to which this invention belongs unless a term has been otherwise defined. It will be further understood that terms, such as those defined in commonly used dictionaries, should be interpreted as having a meaning as commonly understood by a person having ordinary skill in the art to which this invention belongs. It will be further understood that terms, such as those defined in commonly used dictionaries, should be interpreted as having a meaning that is consistent with their meaning in the context of the relevant art and the present disclosure. Such commonly used terms will not be interpreted in an idealized or overly formal sense unless the disclosure herein expressly so defines otherwise.

In the semiconductor industry, there is an increased desire to reduce the cost of producing semiconductor devices such as non-volatile memory devices. The market demands smaller and cheaper devices. In the production of conventional semiconductor devices, the array and the periphery regions are patterned separately using separate masks. The use of separate process steps adds complexity and cost to the process.

There remains a need in the art for alternative memory device structures and methods of preparing those structures that allow for a reduction in cost and complexity.

The present inventors have found that by forming the layout of the device as described herein, the patterning of the array and periphery regions can be integrated. The resulting semiconductor device can be prepared at a reduced cost and with an increase in efficiency. Utilizing the process steps described herein, the patterning of the array and periphery regions can be combined and provide a suitable semiconductor device.

Non-volatile memory refers to a semiconductor device which is able to store information even when the supply of electricity is removed from the memory. Non-volatile memory includes, without limitation, Mask Read-Only Memory, Programmable Read-Only Memory, Erasable Programmable Read-Only Memory, Electrically Erasable Programmable Read-Only Memory, and Flash Memory, such as NAND and NOR devices.

As used herein, "array pattern" refers to the pattern formed within the central region or an array region of a semiconductor device. In a fully formed integrated circuit, the "array region" is typically densely populated with conducting lines and electrical devices that may include transistors and capacitors. The electrical devices may form a plurality of memory cells that are typically arranged in a grid pattern at the intersection of word lines and bit lines.

As may be used interchangeably herein, "periphery pattern" or "peripheral pattern" refers to the pattern formed in the periphery region of the semiconductor device. The "periphery region" is the area surrounding the array region. The periphery region typically includes components that support the operations of, for example, the memory cells within the array region.

As used herein, "space" refers to the absence of one or more layers in the device such that a void is formed in the cross-section of the device. For instance, in FIG. 1(a), spaces are formed between word lines and pads.

As used here, "pad pattern" refers to a pattern formed on the semiconductor device for placement of one or more pads. As subsequent steps are performed, in the pad pattern, one or more pads may be formed. As used herein, "word line pattern" refers to a pattern formed on the semiconductor device for placement of one or more word lines. As subsequent steps are performed, in the word line pattern, one or more word lines may be formed.

As used herein, "boundary area" refers to the area around the connection point of a word line and a pad. The "connection point" refers to the location where the word line comes in contact with a pad. The word line that connects to the word line pad is referred to as the "connecting word line." The inventors have found that, in some embodiments, by forming a certain layout of the pad and connecting word line, the patterning of the array and periphery regions can be integrated. When forming this layout, the boundary area may be etched such that further processing is made easier. The boundary area may be etched prior to formation of individual word lines or pads to enable the formation of those word lines or pads. The etching of the boundary area may create a pattern, such as a semicircle or pendulum, that may be subsequently used for patterning the desired final structure or layout of the semiconductor device. The pendulum-shape can be seen in FIG. 1, in the area between adjacent pads.

FIG. 1 illustrates cross-sectional views of a semiconductor device prepared in accordance with embodiments of the present invention. FIG. 1 provides a cross section of the semiconductor device in the array region and in the periphery region. The array cross section is represented by the Y1 axis line and the periphery cross section is presented by X1 and X2 axis lines. The X1 cross section is made between four pads. The X2 cross section is made over two adjacent pads. The cross sections are illustrated in FIG. 1(a) with identifications for the Select Gate, Word Line, Word Line PAD Space, and Word Line PAD. An overview of the semiconductor illustrating the locations for each cross section is provided in FIG. 1(b). An enlarged view of adjacent word line pads is provided in FIG. 1(c).

As shown in FIG. 1, the semiconductor device of this embodiment comprises a substrate 110 and a film stack 120. The film stack 120 has been etched to form desired features in each of the array and periphery regions of the device. In some embodiments, the film stack 120 may comprise an oxide hard mask, a control gate, an interpoly dielectric layer, a floating gate, and a tunnel oxide layer. The film stack may comprise any suitable layers in any suitable order. For instance, in some embodiments, the film stack may comprise various layers as buried diffusion oxide layer, tunnel oxide layer, floating gate, control gate, high density plasma, or combinations thereof. In some embodiments, a shallow trench isolation ("STI") structure may be formed in the substrate. Generally, an STI is defined by sidewalls and a bottom and comprises dielectric material such as silicon oxide ($SiO_2$), silicon nitride ($Si_3N_4$), silicon oxynitride ($SiO_xN_y$), or any combination thereof.

The substrate may include any underlying material or materials upon which a device, a circuit, an epitaxial layer, or a semiconductor may be formed. Generally, a substrate may be used to define the layer or layers that underlie a semiconductor device or even forms the base layer of a semiconductor device. Without intending to be limiting, the substrate may include one or any combination of silicon, doped silicon, germanium, silicon germanium, semiconductor compounds, or other semiconductor materials.

The dielectric layers for the film stack may comprise any suitable dielectric material, such as silicon oxide ($SiO_2$), silicon nitride ($Si_3N_4$), silicon oxynitride ($SiO_xN_y$), or any combination thereof. For instance, the oxide hard mask layer, the interpoly dielectric layer, and the tunnel oxide layer may comprise silicon oxide ($SiO_2$), silicon nitride ($Si_3N_4$), silicon oxynitride ($SiO_xN_y$), or any combination thereof. In certain embodiments, one or more dielectric layers may comprise an oxide-nitride-oxide (ONO) layer. One or more dielectric layers may be formed by any suitable deposition process, such as chemical vapor deposition (CVD) or spin-on dielectric processing. In certain embodiments, one or more dielectric layers may be grown on the substrate.

In some embodiments, the conductive layers may comprise polysilicon. For instance, the control gate and floating gate may comprise polysilicon. One or more conductive layers may be formed by any suitable process, such as CVD or spin coating.

As shown in FIG. 1(c), adjacent pads may have a space between the pads. In certain embodiments of the invention, such as that illustrated in FIG. 1, the space between adjacent pads may have a width represented by "a" and a width represented by "b." For the embodiment of FIG. 1, a width represented by a and a width represented by b is illustrated in FIG. 1(c). In some embodiments, the space represented by "a" is the narrowest space between adjacent pads. In certain embodiments, the width represented by a may be smaller than the width represented by b. That is, in certain embodiments, adjacent pads may have a space between the pads where the space has a narrow portion and a wider portion.

In some embodiments, a pad in the device may have a first width located adjacent to a connecting word line and a second width opposite the connecting word line. As used herein, "connecting word line" refers to the word line that connects to the pad. Generally, a pad will only have one connecting word line. For instance, as shown in FIG. 1(c), the pad in this embodiment has a width D1 adjacent to the connecting word line (referred to in FIG. 1(c) as the "Line end") and a width D2 opposite to the connecting word line. In certain embodiments, the first width D1 of the pad located adjacent to the word line may be smaller than the second width D2 of the pad opposite the word line. In some embodiments, the first width of the pad may be smaller than the second width of the pad by about 0.05 to 1.5 times the narrowest width of space between adjacent pads. As shown in FIG. 1, the pad has two widths, where the first width, represented by D1, is smaller than the second width by about 0.05-1.5 times the space between that pad and a second pad (the space being represented by "a"). That is, in some embodiments, the first width of the pad may be about 0.05 to about 1.5 times smaller than the narrowest distance between adjacent pads.

In some embodiments of the present invention, more than one pad has two widths, where the first width is smaller than the second width by about 0.05-1.5 times the space between that pad and an adjacent pad. As shown in FIG. 1, adjacent pads may be mirror images such that both word line pads have two widths where the first width is smaller than the second width by about 0.05-1.5 times the space between each word line pad. In some embodiments, the word line pads are mirror images across the X1 axis. FIG. 1 illustrates an embodiment where the word line pads are mirror images across the X1 axis.

In some embodiments of the present invention, a semiconductor device may be formed from a structure comprising a substrate and a film stack. In certain embodiments, the structure may further comprise core material for patterning the array and periphery regions. For instance, as shown in FIG. 1, the structure comprises a silicon substrate 110, a word line film stack 120, a polysilicon core material 130, and an advanced patterning film ("APF") core material 140. While FIG. 2 provides specific exemplary materials for each layer, the present invention is not so limited and can be used with any suitable material. For instance, the substrate may comprise materials such as those previously described (e.g., silicon, doped silicon, germanium, silicon germanium, semiconductor compounds, or other semiconductor materials). The film stack may be any film stack desired in the final structure and may be formed along the substrate by any suitable process. The core material may be any suitable material for patterning such as APF, polysilicon, and combinations thereof, and may be formed on the substrate in any suitable process in any suitable order.

FIG. 2 provides a cross section of the semiconductor device in the intended array and periphery sections. The array cross section is represented by Y1 and the periphery cross section is presented by X1 and X2. The cross sections are illustrated in FIG. 2(a) with identifiers for the Select Gate, Word Line, Word Line PAD Space, and Word Line PAD. An overview of the semiconductor illustrating where the cross sections are made is provided in FIG. 2(b). An enlarged view of where adjacent word line pads may be formed is provided in FIG. 2(c).

In certain embodiments, it may be desirable to form a patterned second core layer. To form this patterned core, in some embodiments, a photo resist may be applied to the device and with a single mask may form a pattern over the first core material. FIG. 2 illustrates cross-sectional views of a semiconductor device after applying a photo resist 150 to the device in accordance with embodiments of the present invention. The photo resist may be any suitable photo resist that allows the patterning of the underlying core material. As shown in FIG. 2, in certain embodiments, the photo resist 150 may be applied to form a pattern over the second core material 140.

In some embodiments, the photo resist pattern may form a pattern for subsequent pad formation and for subsequent word line formation. In some embodiments, the photo resist pattern for subsequent word line formation using the first photo resist may have a width of about 10 to 70 nm, such as about 20 to 60 nm, or about 30 to 50 nm. FIG. 2 illustrates an embodiment where the photo resist pattern for subsequent word line formation has a width of about 30 to 50 nm as represented by D3 in FIG. 2(c).

In some embodiments, the photo resist pattern for subsequent pad formation may have a width greater than about 200 nm wide, such as greater than about 400 nm, or greater than about 600 nm. FIG. 2 illustrates an embodiment where the photo resist pattern for subsequent pad formation has a width greater than about 600 nm as represented by D4 in FIG. 2(c).

Using the photo resist, the device may be etched. FIG. 3 illustrates cross-sectional views of a semiconductor device after etching a second core layer to form a patterned second core layer in accordance with embodiments of the present invention. FIG. 3 provides a cross section of the semiconductor device in the intended array and periphery sections. The array cross section is represented by Y1 and the periphery cross section is presented by X1 and X2. The cross sections are illustrated in FIG. 3(a) with identifiers for the Select Gate, Word Line, Word Line PAD Space, and Word Line PAD. An overview of the semiconductor illustrating where the cross sections are made is provided in FIG. 3(b). An enlarged view of where adjacent word line pads may be formed is provided in FIG. 3(c).

FIG. 3 illustrates a device of embodiments of the present invention after etching a second core material to provide a patterned second core layer. As used herein, "patterned second core layer" will refer to the second core material even though the patterned second core layer may be formed before the patterned first core layer. The photo resist may protect certain desired areas of the core material from etching such that a pattern may be formed. Any suitable etching process may be used to etch the applicable core material. The photo resist may be removed by any known process to leave the core material in the desired pattern.

In some embodiments, the patterned second core layer formed after etching the second core material comprises a pad pattern and a word line pattern. As shown in FIG. 3(c), in some embodiments, the second core material remaining on the substrate may form at least one pad pattern with a width greater than about 600 nm and a word line pattern about 30-50 nm wide. As noted above, the pad pattern may have a width greater than about 200 nm, greater than about 400 nm, or greater than about 600 nm such as the width represented by D4 in FIG. 3(c). The word line pattern may have a width of about 10-70 nm, such as about 20-60 nm, or about 30-50 nm such as the width represented by D3 in FIG. 3(c).

In certain embodiments, spacers may be formed along sidewalls of the patterned second core layer. FIG. 4 illustrates cross-sectional views of a semiconductor device after forming spacers 160 along the sidewalls of the patterned second core layer 140 in accordance with embodiments of the present invention. FIG. 4 provides a cross section of the semiconductor device in the intended array and periphery sections. The array cross section is represented by Y1 and the periphery cross section is presented by X1 and X2. The cross sections are illustrated in FIG. 4(a) with identifiers for the Select Gate, Word Line, Word Line PAD Space, and Word Line PAD. An overview of the semiconductor illustrating where the cross sections are made is provided in FIG. 4(b). An enlarged view of where adjacent word line pads may be formed is provided in FIG. 4(c).

In the embodiment illustrated in FIG. 4, spacers 160 are formed along the sidewalls of the patterned second core layer 140 in accordance with embodiments of the present invention. Spacer material may be deposited or formed on the semiconductor device by any suitable method. Spacer material may be disposed along the surface of the semiconductor device and subjected to a partial etch to form spacers 160 disposed along the sidewalls of the patterned second core layer 140. Trenches, or open areas, may be formed between spacers.

In certain embodiments, the spacer material may comprise any suitable material for forming spacers in self-aligned patterning. For instance, in some embodiments, low-temperature oxide may be deposited on the device and etched to form spacers along the sidewalls of the patterned core. In the embodiment illustrated in FIG. 4, the spacers 160 comprise low-temperature oxide. In certain embodiments, spacers may be formed of a desired thickness, which may be represented by D5 as shown in FIG. 4(c). The spacers may be any suitable thickness, such as from about 5 to 60 nm, about 10 to 50 nm, or from about 20 to 40 nm wide. As shown in FIG. 4(c), in certain embodiments, the spacers 160 may be about 20 to 40 nm wide along the patterned second core layer 140.

In some embodiments, the patterned second core layer may be removed along the device. In some embodiments, such as that illustrated in FIG. 5, the patterned second core layer may be removed leaving spacers disposed along the substrate. FIG. 5 illustrates cross-sectional views of a semiconductor device after removing the patterned second core layer 140 in accordance with embodiments of the present invention. Spacers 160 remain disposed along the device. FIG. 5 provides a cross section of the semiconductor device in the intended array and periphery sections. The array cross section is represented by Y1 and the periphery cross section is presented by X1 and X2. The cross sections are illustrated in FIG. 5(a) with identifiers for the Select Gate, Word Line, Word Line PAD Space, and Word Line PAD. An overview of the semiconductor illustrating where the cross sections are made is provided in FIG. 5(b).

The patterned second core layer may be removed by any suitable process such as dry or wet strip. The spacers disposed along the substrate may provide an outline for subsequent etching.

In some embodiments, it may be desirable to apply a photo resist over certain areas of the semiconductor device to pattern a first core material. FIG. 6 illustrates cross-sectional views of a semiconductor device after applying a photo resist in accordance with embodiments of the present invention. FIG. 6 provides a cross section of the semiconductor device in the intended array and periphery sections. The array cross section is represented by Y1 and the periphery cross section is presented by X1 and X2. The cross sections are illustrated in FIG. 6(a) with identifiers for the Select Gate, Word Line, Word Line PAD Space, and Word Line PAD. An overview of the semiconductor illustrating where the cross sections are made is provided in FIG. 6(b). An enlarged view of a photo resist pattern for subsequent pad formation is provided in FIG. 6(c).

A photo resist may be applied by any suitable process. In the embodiment illustrated in FIG. 6, the photo resist covers locations where pads and transistors may be desired. As shown in FIG. 6, those areas where word lines are desired remain uncovered or unprotected by the photo resist and thus exposed for subsequent etching. For instance, the photo resist may be formed to cover an area for subsequent formation of one or more pads as shown in FIG. 6. In certain embodiments, one or more of these areas for subsequent pad formation may be defined by dimensions A and B, where A is the distance from the underlying spacer to the opposite edge of the photo resist and B is the width of the photo resist. FIG. 6(c) illustrates dimensions A and B for this embodiment. The photo resist may be positioned over spacers such that the spacers are located in the middle of the photo resist (e.g., the distance from the spacer to the opposite edge of the photo resist is equal to the distance from the spacer to the other end of the photo resist). For instance, in FIG. 6, the distance from the spacer to either edge of the photo resist is equal to A. In some embodiments, the distance A may be greater than about 100 nm, such as greater than about 200 nm, or greater than about 250 nm. The photo resist may also have a width B measured the width of the photo resist. The width B may be greater than about 100 nm, such as greater than about 200 nm, greater than about 300 nm, or even greater than about 400 nm. As shown in FIG. 6(c), the spacer 170 may have a width ("D5") from about 20 to 40 nm.

In some embodiments, the device may be etched to form a patterned first core layer along the substrate. FIG. 7 illustrates cross-sectional views of a semiconductor device after etching a patterned first core layer in accordance with embodiments of the present invention. FIG. 7 provides a cross section of the semiconductor device in the intended array and periphery sections. The array cross section is represented by Y1 and the periphery cross section is represented by X1 and X2. The cross sections are illustrated in FIG. 7(a) with identifiers for the Select Gate, Word Line, Word Line PAD Space, and Word Line PAD. An overview of the semiconductor illustrating where the cross sections are made is provided in FIG. 7(b). An enlarged view of where adjacent pads may be formed is provided in FIG. 7(c).

In some embodiments, the first core material may be etched providing a patterned first core layer along the substrate. As shown in FIG. 7, since spacers were formed of a desired thickness, e.g., about 20 to 40 nm, the patterned first core layer includes word line patterns of that desired thickness. For instance, in the embodiment of FIG. 7, the word line pattern has a thickness of about 20 to 40 nm as shown by D6 in FIG. 7(c).

In some embodiments, it may be desirable to trim the patterned first core layer to form word line patterns and pad patterns of a desired thickness. FIG. 8 illustrates cross-sectional views of a semiconductor device after trimming the patterned first core material in accordance with embodiments of the present invention. FIG. 8 provides a cross section of the semiconductor device in the intended array and periphery sections. The array cross section is represented by Y1 and the periphery cross section is presented by X1 and X2. The cross sections are illustrated in FIG. 8(a) with identifiers for the Select Gate, Word Line, Word Line PAD Space, and Word Line PAD. An overview of the semiconductor illustrating where the cross sections are made is provided in FIG. 8(b). An enlarged view of where adjacent word line pads may be formed is provided in FIG. 8(c).

In some embodiments, the patterned first core layer may be trimmed to reach a critical dimension. Semiconductor devices with desired "pitches" (e.g., the distance between features) may thereby be formed. In certain embodiments, the patterned first core layer may be trimmed to form word line patterns with a width of about 5 to 40 nm, such as about 10 to 30 nm, or about 10 to 20 nm. In the embodiment of FIG. 8, the patterned first core layer 130 is trimmed to about 10 to 20 nm for the word line pattern as shown by D7 in FIG. 8(c).

In some embodiments, spacers may be formed along the sidewalls of the patterned first core layer. FIG. 9 illustrates cross-sectional views of a semiconductor device after forming spacers 180 along the sidewalls of the patterned first core layer 130 in the device in accordance with embodiments of the present invention. FIG. 9 provides a cross section of the semiconductor device in the intended array and periphery sections. The array cross section is represented by Y1 and the periphery cross section is presented by X1 and X2. The cross sections are illustrated in FIG. 9(a) with identifiers for the Select Gate, Word Line, Word Line PAD Space, and Word Line PAD. An overview of the semiconductor illustrating where the cross sections are made is provided in FIG. 9(b). An enlarged view of where adjacent word line pads may be formed is provided in FIG. 9(c).

In some embodiments, such as the embodiment illustrated in FIG. 9, spacers 180 may be formed along the patterned first core layer 130. In certain embodiments, spacer material may be deposited or formed on the semiconductor device by any suitable method. Spacer material may be disposed along the surface of the semiconductor device and subjected to a partial etch to form spacers 180 disposed along the sidewalls of the patterned first core layer 130. Trenches, or open areas, may be formed between spacers.

In certain embodiments, the spacer material may comprise any suitable material for forming spacers in self-aligned patterning. For instance, in some embodiments, low-temperature oxide that may be deposited on the device and etched to form spacers along the sidewalls of the patterned core. In the embodiment illustrated in FIG. 9, the spacers 180 comprise low-temperature oxide. In certain embodiments, spacers may be formed of a desired thickness, which may be represented by D8. The spacers may be any suitable thickness, such as from about 5 to 60 nm, from about 10 to 50 nm, from about 20 to 40 nm wide, or from about 10 to 20 nm. As shown in FIG. 9(c), in certain embodiments, the spacers 180 may be about 10 to 20 nm wide along the patterned first core layer 130.

In certain embodiments, it may be desirable to remove the patterned first core layer in some areas while maintaining the patterned first core layer in other areas of the device. FIG. 10 illustrates cross-sectional views of a semiconductor device after removing portions of the patterned first core layer in the device in accordance with embodiments of the present invention. FIG. 10 provides a cross section of the semiconductor device in the intended array and periphery sections. The array cross section is represented by Y1 and the periphery cross section is represented by X1 and X2. The cross sections are illustrated in FIG. 10(a) with identifiers for the Select Gate, Word Line, Word Line PAD Space, and Word Line PAD. An overview of the semiconductor illustrating where the cross sections are made is provided in FIG. 10(b). An enlarged view of where adjacent word line pads may be formed is provided in FIG. 10(c).

In certain embodiments, prior to removing portions of the first core layer, a polymer may be loaded onto the device. In certain areas, such as smaller narrow areas, less polymer may be loaded, while in other areas, such as larger open areas, more polymer may accumulate in the area. Subsequent etching may remove more patterned first core material in areas with less polymer, while leaving patterned first core material in areas with more polymer. For instance, as shown in FIG. 10, the first core material may be removed from narrow areas between spacers (see e.g., in the Y1 cross section, "Word Line" in FIG. 10(a)), while the first core material may remain in wider areas between spacers (see e.g., in the X2 cross section, "Word Line PADS" in FIG. 10(a)). The different removal amounts may be attributed to the "loading effect" of the polymer. For instance, in certain embodiments, due to more polymer being loaded in larger areas, the first core material between closely spaced spacers may be removed while the first core material between further apart spacers may remain. As more polymer may be loaded between farther apart spacers, such as those in the periphery region, the first core material may not be removed in these areas during subsequent etching. Less or no polymer material may be loaded between closely spaced spacers, such as those in the array region, such that the first core material in such locations may be removed.

Thus, in certain embodiments, when etching, the first core material may be removed in the smaller areas and not in the larger areas. As shown in FIGS. 10(a) and 7(b), the first core material 130 is removed between spacers 180 in word line patterns, as these spacers are located close together. As also shown in FIGS. 10(a) and 7(b), along the X2 axis, the first core material 130 is not removed between spacers 180. More polymer has deposited in this large area between spacers preventing the etching of the first core material.

In some embodiments, smaller narrow areas may come in contact with larger open areas which as noted previously may be referred to as the "boundary area." In certain embodiments, portions of the first core material may be removed at this boundary area. For instance, as shown in FIG. 10(c), first core material is removed in the boundary area in the pad pattern. In certain embodiments, the removal of this material may form a pattern in the pad pattern. This pattern may be any shape such as the semicircle or pendulum shape illustrated in FIG. 10(c). In some embodiments, the shape may have a dimension such as radius C as illustrated in FIG. 10(c). In certain embodiments, this dimension may be about 50 to 500 nm, such as about 100 to 400 nm, or about 200 to 300 nm. For instance, in the embodiment illustrated in FIG. 10(c), a semicircle may be formed in the pad pattern with a radius of about 200 to 300 nm. In the embodiment of FIG. 10(c), the pad pattern has two etched areas that merge. Etched areas in boundary areas may not merge in other embodiments of the present invention. In certain embodiments, the etching of the first core material may be manipulated to modify the resulting pattern formed in the boundary area. When etching, various etching gases may be used, such as $CH_2F_2$, $C_4F_8$, $C_4F_6$, $C_5F_8$, $CH_3F$, $CHF_3$, and combinations thereof, and at various gas flow rates, such as from 10 to 100 sccm. By adjusting the etching gas composition and the gas flow rate, desired patterns may be formed in the boundary area, such as a semicircle with a radius of 200 to 300 nm.

FIG. 11 illustrates the removal of portions of the first patterned core layer along the device. As shown in FIG. 11, due to the loading effect, portions of the pad pattern may be removed forming semicircles in the boundary areas of connecting word line patterns and the respective pad pattern. In some embodiments, an etched pattern in a boundary area may merge with an adjacent etched pattern in another boundary area. In the embodiment illustrated in FIG. 11, two adjacent patterns merge in the pad pattern forming an open profile.

In certain embodiments, it may be desirable to etch the film stack to form desired features in the device. FIG. 12 illustrates cross-sectional views of a semiconductor device after etching the film stack to form word lines, pads, and transistors in the semiconductor device. FIG. 12 provides a cross section of the semiconductor device in the array and periphery sections. The array cross section is represented by Y1 and the periphery cross section is presented by X1 and X2. The cross sections are illustrated in FIG. 12(a) with identifiers for the Select Gate, Word Line, Word Line PAD Space, and Word Line PAD. An overview of the semiconductor illustrating where the cross sections are made is provided in FIG. 12(b). An enlarged view of where adjacent word line pads may be formed is provided in FIG. 12(c).

The film stack may be etched by any suitable process to form the desired features. In certain embodiments, the pattern formed after removing portions of the patterned second core layer may be transferred to the film stack. For instance, as shown in FIG. 12(c), the pattern formed in the pad pattern (e.g., semicircles formed in the pad pattern) may be transferred to the film stack forming pads comprising such pattern. The pad pattern formed in the film stack may be of any suitable shape. In some embodiments, such as that illustrated in FIG. 12(c), film stack may be etched to form semicircles in one or more pads. The semicircles may have any suitable dimensions such as a radius of about 50 to 500 nm, such as about 100 to 400 nm, or about 200 to 300 nm. For instance, in the embodiment illustrated in FIG. 12(c), one or more semicircles are formed with a radius C of about 200 to 300 nm. In the embodiment of FIG. 12(c), the semicircles merge due to the loading effect discussed previously. However, in other embodiments, the semicircles or any shape formed in the pads may not merge.

In some embodiments, the pads formed by etching the film stack may be connected to more than one word line. That is, in some embodiments, a single pad may be connected to more than one word line. In such embodiments, it may be desirable to further etch the pad such that a pad is connected to only one word line. In some embodiments, if a pad is connected to more than one word line, the pad may short circuit resulting in failure of the device. FIG. 13 illustrates an embodiment where a photo resist is applied to cut a pad into multiple pads. FIG. 13 provides a cross section of the semiconductor device in the array and periphery sections. The array cross section is represented by Y1 and the periphery cross section is presented by X1 and X2. The cross sections are illustrated in FIG. 13(a) with identifiers for the Select Gate, Word Line, Word Line PAD Space, and Word Line PAD. An overview of the semiconductor illustrating where the cross sections are made is provided in FIG. 13(b). An enlarged view of where adjacent word line pads may be formed is provided in FIG. 13(c).

In some embodiments, a photo resist may be applied to the device such that portions of pads connected to multiple word lines is exposed for subsequent etching. The portions unprotected may be etched to separate pads and provide a device where each pad is only connected to a single word line.

The portion of the underlying pad exposed for etching may have a desired width, such as that represented by "a" in FIG. 13(c). The width may be any suitable width to allow for separation of the pad and to provide a device where each pad is only connected to a single word line.

In some embodiments of the present invention, the width may be of a certain relationship with a width of the pad subsequently formed. That is, the photo resist may be applied to the device to form an etched space between adjacent pads where the etched space is of a width a and one or both of the adjacent pads have a first width that greater is greater than a second width of the pad by about 0.05 to 1.5 times the width a. In certain embodiments, it may be desirable to form a pad that has a first width adjacent to the connecting word line that is smaller than a second width opposite to the connecting word line by about 0.05 to 1.5 times the width a. For instance, the pad may have a first width wider than a second width by about 0.1, 0.15, 0.2, 0.25, 0.3, 0.35, 0.4, 0.45, 0.5, 0.55, 0.6, 0.65, 0.7, 0.75, 0.8, 0.85, 0.9, 1.0, 1.05, 1.1, 1.15, 1.2, 1.25, 1.3, 1.35, 1.4, 1.45, or 1.5 times the width a.

FIG. 14 illustrates cross-sectional views of a semiconductor device after etching the film stack to form separate adjacent pads in accordance with embodiments of the present invention. FIG. 14 provides a cross section of the semiconductor device in the array and periphery sections. The array cross section is represented by Y1 and the periphery cross section is presented by X1 and X2. The cross sections are illustrated in FIG. 14(a) with identifiers for the Select Gate, Word Line, Word Line PAD Space, and Word Line PAD. An overview of the semiconductor illustrating where the cross sections are made is provided in FIG. 14(b). As shown in FIGS. 14(a) and 14(b), particularly in the X2 cross-section, adjacent pads may be formed by etching the uncovered areas in the device.

In embodiments where a photo resist was applied to further etch adjacent pads, the photo resist may be removed. A semiconductor device of the present invention may thereby be provided, such as that illustrated in FIG. 1.

FIG. 15 illustrates certain steps of embodiments of the present invention in preparing semiconductor devices. FIG. 15 illustrates that, in certain embodiments, the placement of a photo resist when forming the patterned first core layer provides a foundation for the final pattern in the film stack. In some embodiments, such as that illustrated in FIG. 15, a photo resist may be applied to the semiconductor device such that the spacers are aligned in the middle of the photo resist. For instance, as shown in FIG. 15, the distance (which may be referred to as "A") from the spacers (referred to as "SPR1") to the opposite edge of the photo resist (which may be referred to as "PLH PHOTO") is equal to the distance from the spacers to the other edge of the photo resist. Without intending to be bound by theory, in certain embodiments, by placing the photoresist along the spacers such that the spacers are located in the middle of the photo resist, a larger window for subsequent etching steps may be formed. In certain embodiments, after forming the photo resist, subsequent steps such as etching the film stack may be performed. For instance, in FIG. 15, subsequent etching is illustrated (referred to as "PL3/PLC ETCH"). As shown in FIG. 15, the etching window for subsequent process steps may be enlarged by forming the photo resist along the spacers such that the spacers are in the middle of the photo resist.

An aspect of the invention provides a semiconductor fabricated using the processes or methods for fabricating a semiconductor as disclosed herein. In certain other embodiments of the invention, a semiconductor device may be fabricated using any combination of the method steps as described herein. Further, any manufacturing process known to those having ordinary skill in the art having the benefit of this disclosure may be used to manufacture the semiconductor devices in accordance with embodiments of the present invention.

FIGS. 16(a) and 16(b) provide a flow chart detailing a method of forming a semiconductor device in accordance with embodiments of the present invention. In certain embodiments, a method for manufacturing a semiconductor device according to the present invention may comprise, providing a substrate 410 and forming a film stack along the substrate 420. In some embodiments, the method may further comprise forming a first core material along the film stack 430, forming a second core material along the film stack 440, and patterning the second core material to form a patterned second core 450. In some embodiments, when patterning the second core material to form a patterned second core, the method may comprise forming a first photo resist along select regions of the substrate 460 and etching the second core material not covered by the first photo resist 470. In some embodiments, such as that illustrated in FIG. 16(a), the method of manufacturing a semiconductor device according to the present invention may comprise second core spacers along sidewalls of the patterned second core 480 and removing the patterned second core 490. As shown in FIG. 16(b), the method may further comprise patterning the first core material to form a patterned first core 500, forming first core spacers along sidewalls of the patterned first core 540, and removing portions of the patterned first core 550. In some embodiments, when patterning the first core material, the method may comprise forming a second photo resist along select regions of the substrate 510 and etching the first core material not covered by the second photo resist 520. Still further, the method may comprise trimming the patterned first core 530. In some embodiments, the method may further comprise etching the film stack 560. In yet additional embodiments, the method may further comprise forming a third photo resist along select regions of the film stack 570, etching the film stack to form the first and second word line pads 580, and removing the third photo resist 590. Methods of the present invention may include various combinations of the steps illustrated in FIGS. 16(a) and 16(b).

Any of the processes, methods, or techniques as described herein may be used to accomplish any of these steps of the inventive method. Certain of the steps generally described above in the method may themselves comprise other sub-steps that have not necessarily been identified. Such additional steps are understood by a person of ordinary skill in the art having the benefit of this disclosure.

The present invention may be used for the fabrication of any memory device. For instance, the method of the present invention may be applied to the fabrication of any non-volatile memory device, such as NAND flash memory devices, NOR flash memory devices, logic device, or any other device where self-aligned multiple patterning is used.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A method for manufacturing a semiconductor device, the method comprising:
   providing a substrate;
   forming a film stack along the substrate;
   etching the film stack to form a first word line pad and a second word line pad, wherein the first word line pad comprises a first pad width adjacent to a word line and a second pad width opposite the word line, wherein the first pad width is not equal to the second pad width;
   forming a first core material along the film stack;

forming a second core material along the film stack;

patterning the second core material to form a patterned second core;

forming second core spacers along sidewalls of the patterned second core;

removing the patterned second core;

patterning the first core material to form a patterned first core;

forming first core spacers along sidewalls of the patterned first core; and removing portions of the patterned first core to define remaining portions of the patterned first core, wherein the remaining portions are positioned between the first core spacers in at least one of the first word line pad or the second word line pad to define a first core pad pattern, and wherein the remaining portions comprise edges that define two semicircles such that each of the semicircles comprises an arc, and the two semicircles are connected to each other at the arcs.

2. The method for manufacturing a semiconductor device according to claim 1, wherein patterning the second core material to form a patterned second core comprises forming a photo resist along select regions of the substrate and etching the first core material not covered by the photo resist.

3. The method for manufacturing a semiconductor device according to claim 1, wherein patterning the first core material to form a patterned first core comprises forming a photo resist along select regions of the substrate and etching the first core material not covered by the photo resist.

4. The method for manufacturing a semiconductor device according to claim 1, further comprising trimming the patterned first core.

5. The method for manufacturing a semiconductor device according to claim 4, wherein trimming the patterned first core comprises trimming a word line pattern to have a width of about 10 to about 20 nm.

6. The method for manufacturing a semiconductor device according to claim 1, further comprising applying a photo resist along select regions of the film stack prior to etching the film stack to form the first word line pad and the second word line pad.

7. The method for manufacturing a semiconductor device according to claim 1, wherein removing portions of the patterned first core comprises removing the patterned first core in a semicircle in the first core pad pattern along the film stack.

8. The method for manufacturing a semiconductor device according to claim 7, wherein the semicircle has a radius of about 200 to 300 nm.

9. The method for manufacturing a semiconductor device according to claim 1, wherein patterning the second core material to form a patterned second core comprises forming a second core pad pattern and a word line pattern, wherein the second core pad pattern has a width of greater than about 600 nm and the word line pattern has a width of about 10 to about 30 nm.

10. The method for manufacturing a semiconductor device according to claim 1, wherein forming second core spacers along sidewalls of the patterned second core comprises forming spacers with a width of about 20 to about 40 nm.

11. The method for manufacturing a semiconductor device according to claim 1, wherein etching the film stack to form a first word line pad and a second word line pad comprises forming a space between the first word line pad and the second word line pad, the space comprising a first width of the space represented by a, and wherein the first pad width is smaller than the second pad width by about 0.05 to 1.5 times width a.

* * * * *